(12) United States Patent
Schneggenburger et al.

(10) Patent No.: US 11,369,046 B2
(45) Date of Patent: Jun. 21, 2022

(54) ELECTRIC CONTROLLER WITH HEAT SINK FORMING COOLING AIR CHANNEL INSIDE HOUSING

(71) Applicant: Lenze Automation GmbH, Aerzen (DE)

(72) Inventors: Christof Schneggenburger, Guettingen (CH); Bernhard Laeng, Romanshorn (CH); Alex Itten, Romanshorn (CH); Tobias Diefenbacher, Josefen (CH)

(73) Assignee: Lenze Automation GmbH, Aerzen (DE)

( * ) Notice: Subject to any disclaimer, the term of this patent is extended or adjusted under 35 U.S.C. 154(b) by 304 days.

(21) Appl. No.: 16/606,370

(22) PCT Filed: Apr. 18, 2018

(86) PCT No.: PCT/EP2018/059939
§ 371 (c)(1),
(2) Date: Oct. 18, 2019

(87) PCT Pub. No.: WO2018/192994
PCT Pub. Date: Oct. 25, 2018

(65) Prior Publication Data
US 2021/0410325 A1 Dec. 30, 2021

(30) Foreign Application Priority Data
Apr. 21, 2017 (DE) ...................... 10 2017 206 775.6

(51) Int. Cl.
*H05K 7/20* (2006.01)
(52) U.S. Cl.
CPC ..... *H05K 7/20918* (2013.01); *H05K 7/20163* (2013.01)

(58) Field of Classification Search
CPC .......... H05K 7/20163; H05K 7/20909; H05K 7/20918; H01L 23/34–4735
See application file for complete search history.

(56) References Cited

U.S. PATENT DOCUMENTS

| 5,235,491 A | 8/1993 | Weiss |
| 6,426,874 B2 | 7/2002 | Kajiura |

(Continued)

FOREIGN PATENT DOCUMENTS

| CN | 1713808 A | 12/2005 |
| CN | 1826204 A | 8/2006 |

(Continued)

OTHER PUBLICATIONS

Chinese-language Office Action issued in Chinese Application No. 201880026316.4 dated Apr. 3, 2020 (nine pages).

(Continued)

*Primary Examiner* — Zachary Pape
(74) *Attorney, Agent, or Firm* — Crowell & Moring LLP

(57) ABSTRACT

An electrical controller includes a housing, wherein the housing has cooling air openings on two different housing sides. A heat sink is arranged inside the housing, in particular so as to be protected against contact, and forms a cooling air channel, wherein the cooling air channel runs between the cooling air openings of the different housing sides. An electrically insulating holding element is designed to mechanically fix the heat sink inside the housing in a manner electrically insulated from the housing. A number of components to be cooled are provided, wherein the components are thermally conductively coupled to the heat sink and are held by the heat sink.

13 Claims, 2 Drawing Sheets

(56) References Cited

U.S. PATENT DOCUMENTS

| | | | | |
|---|---|---|---|---|
| 6,493,227 | B2* | 12/2002 | Nielsen | H05K 7/20918 165/185 |
| 8,004,836 | B2* | 8/2011 | Kauranen | H05K 7/20918 361/690 |
| 8,787,018 | B2* | 7/2014 | Nagano | H05K 7/20918 361/690 |
| 10,110,141 | B2 | 10/2018 | Bethke et al. | |
| 10,362,703 | B2* | 7/2019 | Blosch | H05K 7/20927 |
| 2001/0038526 | A1 | 11/2001 | Kajiura | |
| 2005/0280997 | A1 | 12/2005 | Maeda | |
| 2007/0034617 | A1 | 2/2007 | Oyama et al. | |
| 2011/0199736 | A1 | 8/2011 | Sawada et al. | |
| 2011/0292611 | A1* | 12/2011 | Higuchi | H01L 25/115 361/717 |
| 2013/0027848 | A1 | 1/2013 | Said | |
| 2014/0077611 | A1* | 3/2014 | Young | H01G 11/10 307/82 |
| 2015/0049436 | A1 | 2/2015 | Wu et al. | |
| 2015/0245537 | A1 | 8/2015 | Sakuma et al. | |
| 2016/0037677 | A1* | 2/2016 | Yamanaka | H05K 7/20918 361/697 |
| 2018/0228047 | A1* | 8/2018 | Ota | H02G 3/086 |
| 2018/0332731 | A1* | 11/2018 | Kita | H01F 27/025 |

FOREIGN PATENT DOCUMENTS

| | | | | |
|---|---|---|---|---|
| CN | 202949346 U | | 5/2013 | |
| CN | 104295958 A | | 1/2015 | |
| CN | 205304641 U | | 6/2016 | |
| DE | 19904279 A1 | * | 8/2000 | ......... H01L 23/3735 |
| DE | 20 2006 019 141 U1 | | 5/2007 | |
| DE | 10 2006 038 541 A1 | | 2/2008 | |
| DE | 10 2011 000 706 A1 | | 3/2012 | |
| DE | 10 2012 001 120 A1 | | 7/2013 | |
| EP | 0 455 969 A1 | | 11/1991 | |
| EP | 2 552 184 A2 | | 1/2013 | |
| WO | WO 2013/056933 A2 | | 4/2013 | |
| WO | WO 2017/046180 A1 | | 3/2017 | |
| WO | WO 2017/060092 A1 | | 4/2017 | |

OTHER PUBLICATIONS

Chinese-language Office Action issued in Chinese Application No. 201880026316.4 dated Sep. 22, 2020 (nine (9) pages).

International Search Report (PCT/ISA/210) issued in PCT Application No. PCT/EP2018/059939 dated Jul. 12, 2018 with English translation (seven (7) pages).

German-language Written Opinion (PCT/ISA/237) issued in PCT Application No. PCT/EP2018/059939 dated Jul. 12, 2018 (eight (8) pages).

\* cited by examiner

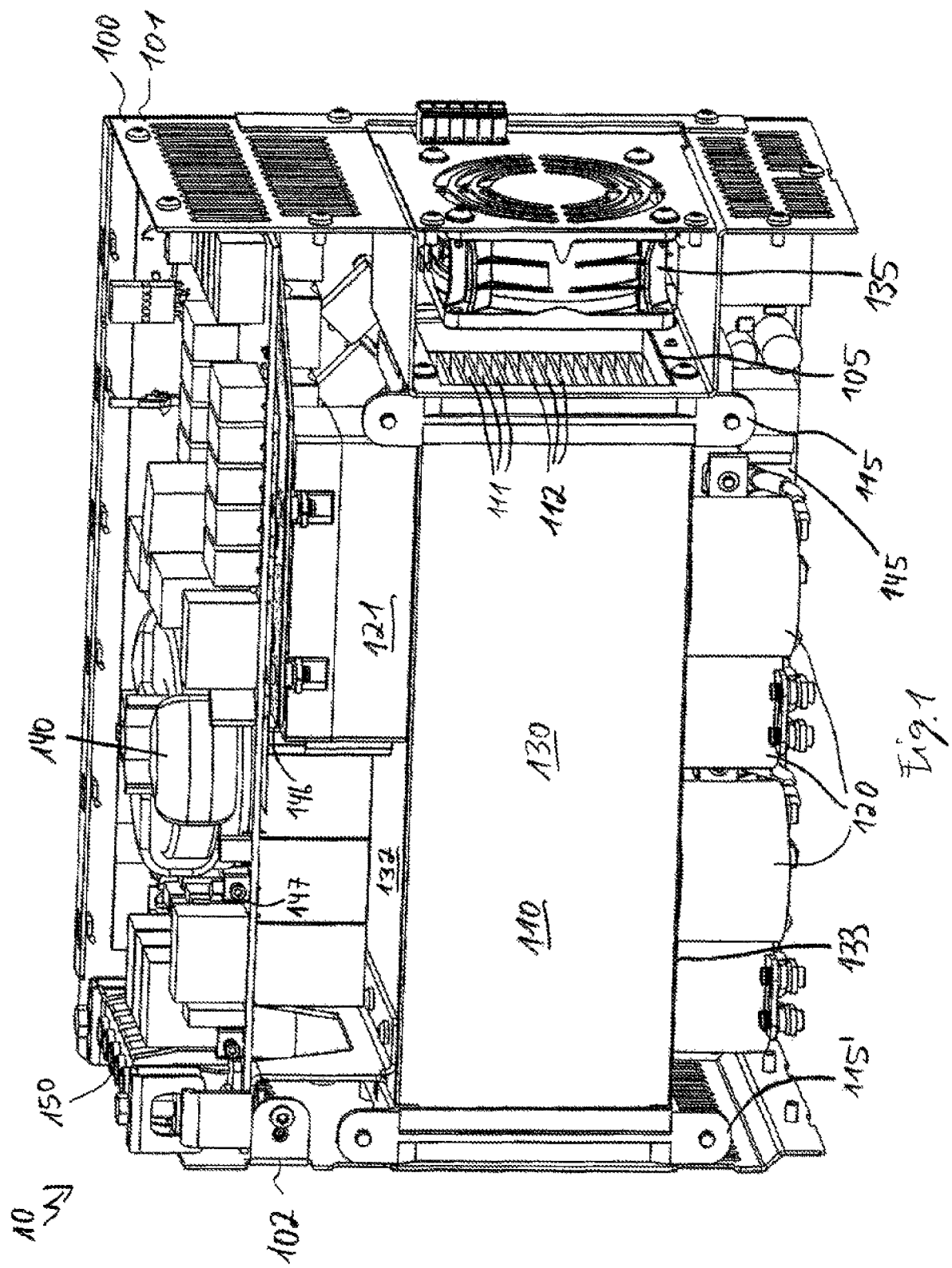

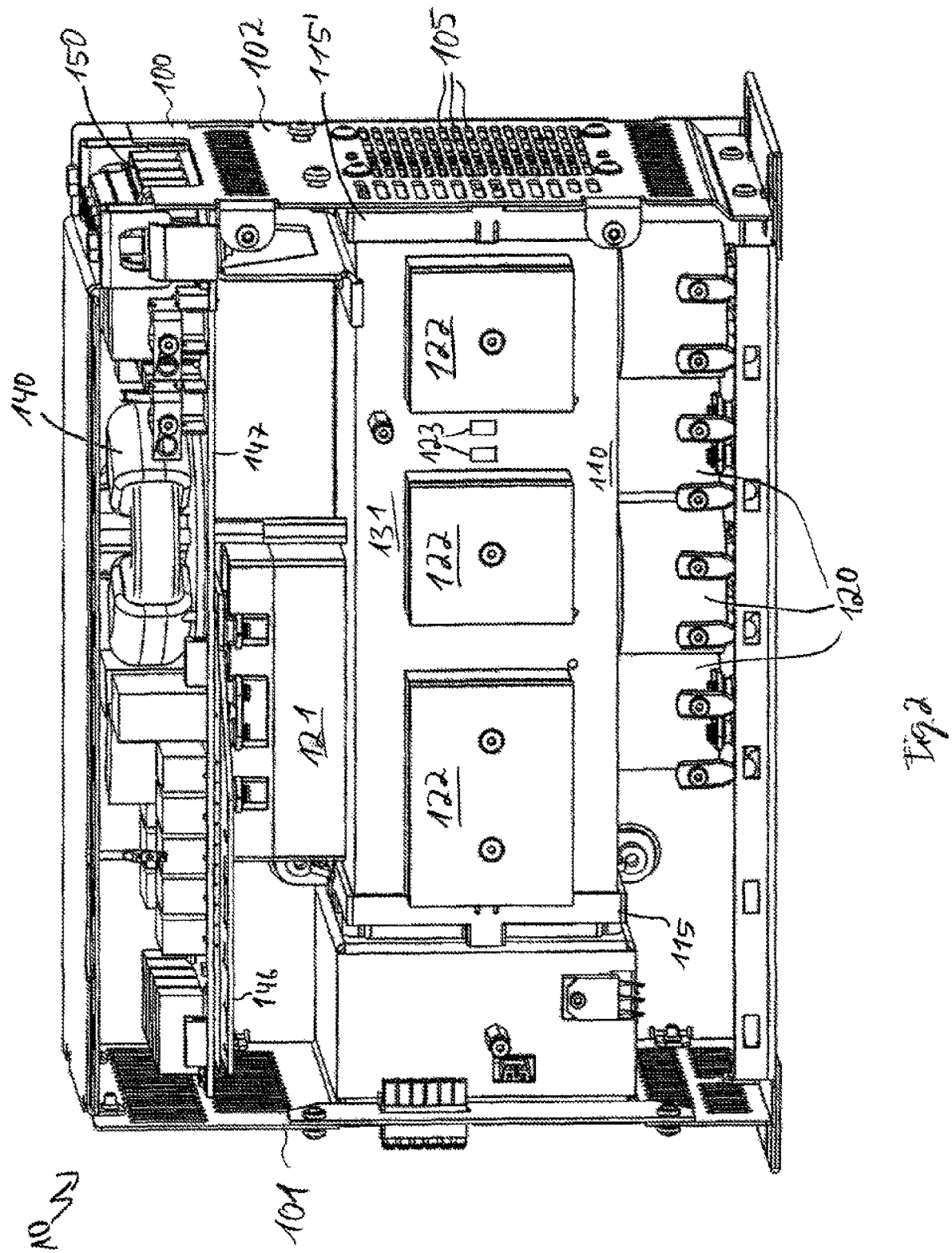

ELECTRIC CONTROLLER WITH HEAT SINK FORMING COOLING AIR CHANNEL INSIDE HOUSING

BACKGROUND AND SUMMARY OF THE INVENTION

The invention relates to an electrical controller.

The invention is based on the object of providing an electrical controller that allows the most optimum possible heat dissipation.

The invention achieves this object by way of an electrical controller according to the claimed invention.

The electrical controller has a housing. The housing may be a housing that is closed in the operating state. The housing may consist of a plurality of housing parts, in particular of three housing parts. The housing may consist of metal. The housing has cooling air openings on two different housing sides. The cooling air openings are intended to channel a cooling medium, in particular air, into the housing interior and/or to channel it back out of the housing interior.

The electrical controller furthermore has a in particular electrically conductive, heat sink that is arranged inside the housing, in particular so as to be protected against contact, and that is electrically insulated from a reference potential, for example protective earth (PE). The heat sink may consist for example of a metal, in particular copper, brass or aluminum. The heat sink may have a higher thermal conductivity than the housing. The heat sink forms a cooling air channel. The cooling air channel may run without a curve or in curved form. The cooling air channel may have an inlet opening and an outlet opening. The cooling air channel may be circumferentially closed. The cooling air channel runs between the cooling air openings of the different housing sides. The cooling air channel may fluidically connect the cooling air openings of the different housing sides to one another. Cooling air is able to enter the housing interior through a cooling air opening on one housing side and be channeled through the cooling air channel to the other housing side, wherein the cooling air leaves the housing again from the cooling air openings on the other housing side.

The electrical controller furthermore has an electrically insulating holding element. The holding element may consist of plastic. The holding element may be produced by way of an injection molding process. The holding element is designed to mechanically fix the heat sink inside the housing in a manner electrically insulated from the housing. The holding element, as an intermediate element, may fluidically connect the cooling air openings of the housing to the cooling air channel. The housing may hold or bear the heat sink by way of the holding element.

In one embodiment, the holding element has a first plastic molded body and a second plastic molded body, wherein the heat sink, on its first end side, is form-fittingly connected, for example by way of a locking connection, to the first plastic molded body and, on its second end side, is form-fittingly connected, for example by way of a locking connection, to the second plastic molded body. The plastic molded bodies may be produced by way of an injection molding process.

The electrical controller furthermore has a number (for example between 1 and 50) of components to be cooled. The components to be cooled may be heat-generating components that for example convert electrical energy supplied during operation thereof at least partly into thermal energy. The components to be cooled are thermally conductively connected to the heat sink. The components may be in touching contact with the heat sink. The components to be cooled are held or borne by the heat sink.

In one embodiment, the two different housing sides lie opposite one another. The two different housing sides may run offset to one another in a parallel plane.

In one embodiment, the number of components to be cooled is thermally conductively coupled to the heat sink on at least two, in particular three, different sides of the heat sink. The heat sink may have a rectangular cross section. The sides of the heat sink may be flat outer surfaces or part of the outside surface of the heat sink.

In one embodiment, the electrical controller has a blower. The blower is designed to bring about a flow of air in the cooling air channel.

In one embodiment, the number of components to be cooled comprises power semiconductors, and/or coils, and/or capacitors.

In one embodiment, the electrical controller is a frequency converter, a servo converter or a feedback unit that is designed for example to feed excess electrical energy present in an electrical intermediate circuit back into a supply grid.

In one embodiment, the power semiconductors are designed to generate a temporally changeable voltage from an intermediate circuit DC voltage, for example in order to feed back to the grid or in order to feed an electrical machine.

In one embodiment, the electrical controller has a power rating that is greater than 25 kilowatts, in particular greater than 48 kilowatts.

In one embodiment, the electrical controller has an electromagnetic compatibility (EMC) filter that is designed to be electrically and thermally decoupled from the heat sink. The EMC filter may have an EMC choke.

In one embodiment, a first number (for example 3 to 10) of coils is thermally conductively coupled to the heat sink on a first side of the heat sink. A second number (for example 1 to 5) of coils is thermally conductively coupled to the heat sink on a second side of the heat sink. The first side of the heat sink lies opposite the second side of the heat sink. The first side of the heat sink may run offset in a parallel plane to the second side of the heat sink.

In one embodiment, a number (for example 1 to 5) of power semiconductors is thermally conductively coupled to the heat sink on a third side of the heat sink. The third side of the heat sink is oriented perpendicular to the first side and to the second side of the heat sink.

In one embodiment, the electrical controller has a first circuit board. The first circuit board may have conductor tracks that electrically conductively connect the electrical components to one another in a suitable manner. The first circuit board is arranged so as to be oriented offset in a parallel plane to the third side of the heat sink and electrically connected to the power semiconductors.

In one embodiment, the electrical controller has a second circuit board. The second circuit board runs offset in a parallel plane to the second side of the heat sink. The second circuit board is electrically connected to the second number of coils.

In one embodiment, the electrical controller has a third circuit board. The third circuit board runs offset in a parallel plane to the second side of the heat sink. The third circuit board bears a number (for example 3 to 20) of electrical contacts. The electrical contacts may be clamp connectors. The electrical contacts are designed to connect an electrical supply line to the electrical controller. The electrical supply line is able to supply the electrical controller with electrical energy and/or the electrical controller is able to control a device to be controlled by way of the electrical supply line. The EMC filter may be arranged on the third circuit board. The second circuit board may be arranged between the third circuit board and the heat sink.

In one embodiment, the second circuit board is mechanically attached to the third circuit board. The second circuit board may be attached to the third circuit board by way of a screw connection, locking connection or plug connection.

In one embodiment, the electrical controller has a number (for example between 1 and 20) of interference suppression capacitors, for example in the form of what are known as Cy capacitors, that are each electrically connected to the heat sink at one of their electrical terminals and are electrically connected to an electrical intermediate circuit of the electrical controller at another of their terminals. Reference is made to the relevant literature in the art with regard to the intermediate circuit.

During the switching of power semiconductors, a high-frequency interfering voltage is coupled into the heat sink due to the typically very thin-wall ceramic insulation underneath the power semiconductors. Similar interference is also transferred into a heat sink in power chokes, whose heat is dissipated by way of the heat sink.

This interference is not able to be influenced directly due to the high switching speeds and the required heat dissipation in the direction of the heat sink.

Cy capacitors are therefore generally inserted between the intermediate circuit and the heat sink as a countermeasure, these capacitors ensuring that at least some of the resultant interfering currents are channeled directly back into the intermediate circuit.

If the heat sink is able to be touched from the outside, then it has to be connected to PE (protective earth), for example in accordance with Protection Class I according to EN 61140. Some of the interfering currents however flow, through this low-resistance connection to PE, into the supply grid, and therefore become visible both in wired and in radiated EMC measurements.

In order to comply with the EMC standards, the Cy capacitors have to be made larger, but this increases the earth conductor current. Increasing the earth conductor current in turn leads to problems in connection with fault current safety switches (FI switches).

In the event of an earth fault on the inverter output in IT networks, then these Cy capacitors are highly thermally loaded and may fail. In order to prevent failures, an IT disconnection point has to be installed at which these Cy capacitors are disconnected from the PE potential. Many users are confronted with this problem, which requires additional support applications.

According to the invention, the heat sink is integrated into the housing of the controller such that it is no longer able to be touched from the outside, such that the heat sink is also able to be insulated by PE in a device, for example of Protection Class I according to EN 61140.

The low-resistance connection to PE is therefore dispensed with, and the interfering currents coupled into the heat sink are not able to leave the controller. The Cy capacitors are therefore able to be sized smaller, and the feedback of the interfering currents into the intermediate circuit functions much better.

In the case of IT networks, thermal overloading of the Cy capacitors is also no longer able to occur because these are no longer connected to PE. It is therefore no longer necessary to disconnect a PE connection.

Electrical insulation of the heat sink is to be achieved according to the invention, in the case of an air-cooled device, with very few extra costs that are considerably less than the EMC interference suppression measures that are additionally required. Overall, controllers are therefore able to be produced with power electronics that are able to be manufactured, for comparable EMC requirements, far more inexpensively than if the heat sink needed to be connected to PE.

According to the invention, the heat sink is packaged in a housing, for example a sheet metal housing, that absorbs the mechanical forces and the weight of the heat sink and all of the components attached or screwed thereto (and jointly cooled) (in particular chokes and power semiconductors) and forwards them to the attachment points of the housing, for example to a rear wall of the housing.

Two plastic parts may in this case take on the function of electrical insulation by mechanically fixing the heat sink through a form-fitting connection, without a conductive connection (for example via a metal screw) bridging the insulation.

The thermal connection of all of the coils or chokes to the heat sink, which similarly couples an interfering voltage into the heat sink as described above, supports the EMC behavior in that this interference is also able to be kept in the device with little expenditure and fed back into the intermediate circuit.

Optimally arranged and correctly sized Cy capacitors reduce the interfering voltages in the heat sink by feeding the coupled-in energy back into the intermediate circuit via a short and therefore low-induction connection.

In order to avoid capacitive coupling to a downstream EMC filter at an output of the controller, for example in the form of a grid feedback unit, the EMC filter is constructed separately from the heat sink and cooled only by the circulating air in the device. This is able to be achieved easily due to the considerably smaller power losses of the EMC filter. By virtue of the spatial separation of the EMC filter, capacitive coupling-in of the interference onto the supply lines (DC and AC) is avoided.

BRIEF DESCRIPTION OF THE DRAWINGS

The invention is described in detail below with reference to the drawings. In the figures:

FIG. 1 shows a perspective illustration of a partially open controller according to the invention in a first view and FIG. 2 shows a perspective illustration of the partially open controller according to the invention in a further view.

DETAILED DESCRIPTION OF THE DRAWINGS

FIG. 1 shows a perspective illustration of a partially open electrical controller 10 in a first view. FIG. 2 shows a perspective illustration of the partially open controller 10 in a further view.

The controller 10 is in this case a (grid) feedback unit that is designed to feed excess electrical energy possibly present in an intermediate circuit back into a supply grid. In this respect, reference is also made to the relevant literature in the art.

The controller has a power rating greater than 48 kW.

The controller 10 has a metal housing 100, wherein the housing 100 has respective cooling air openings 105 on a first housing side 101 and on a second housing side 102 that lies opposite the first housing side.

A heat sink 110 of the controller 10 is arranged so as to be protected against contact in the housing 100. The heat sink forms a closed cooling air channel 111 that runs between the cooling air openings 105 of the first housing side 101 and the second housing side 102. A number of cooling fins 112 is provided inside the cooling air channel 111.

The electrical controller 10 furthermore has an electrically insulating holding element having a first plastic molded body 115 and a second plastic molded body 115', wherein the heat sink 110, on a first end side, is form-fittingly connected to the first plastic molded body 115 and, on a second end side, is form-fittingly connected to the second plastic molded body 115', wherein the plastic molded bodies 115 and 115' are in turn each mechanically fixed to associated housing regions.

The electrical controller 10 furthermore has a number of components 120, 121, 122 to be cooled, wherein the components 120, 121, 122 are thermally conductively coupled to the heat sink 110 and are held by the heat sink 110. The components 120 and 121 are each coils, and the components 122 are power semiconductors.

It is understood that the housing 100 in FIGS. 1 and 2 is illustrated as being partially open for the purposes of describing the invention. In an operating state of the controller 10, the housing 100 is closed, for example by adding further housing parts that are not illustrated, such that it is not possible to touch components potentially channeling a voltage, such as for example the heat sink 110.

The controller 10 furthermore has a blower 135 that is designed to bring about a flow of air in the cooling air channel 111.

The electrical controller 10 furthermore has an EMC filter 140 that is designed to be electrically and thermally decoupled from the heat sink 110.

The components 120, 121, 122 are thermally conductively coupled to various outer sides 130, 131, 132, 133 of the heat sink 110, the sides being outer with respect to the cooling air channel 111. The coils 120 are thermally conductively coupled to the heat sink 110 on a first side 133 of the heat sink 110. The coils 121 are thermally conductively coupled to the heat sink 110 on the second side 132 of the heat sink 110. The first side 133 of the heat sink 110 lies opposite the second side 132 of the heat sink 110. The power semiconductors 122 are thermally conductively coupled to the heat sink 110 on the third side 131 of the heat sink 110, wherein the third side 131 is perpendicular to the first side 133 and the second side 132.

The electrical controller 10 furthermore has a first circuit board 145 that is arranged parallel and offset to the third side 131 of the heat sink 110 and that is electrically connected to the power semiconductors 122.

The electrical controller 10 furthermore has a second circuit board 146 that is arranged parallel and offset to the second side 132 of the heat sink 110 and that is electrically connected to the coils 121.

The electrical controller 10 furthermore has a third circuit board 147 that is arranged parallel and offset to the second side 132 of the heat sink 110 and that bears a number of electrical contacts 150, wherein the electrical contacts 150 are designed to connect an electrical supply line to the electrical controller 10. The second circuit board 146 is mechanically attached to the third circuit board 147.

The electrical controller 10 furthermore has a number (for example two) of Cy interference suppression capacitors 123 that are each electrically connected to the heat sink 110 at one of their electrical terminals and are electrically connected to an electrical intermediate circuit of the electrical controller 10 at another of their terminals.

What is claimed is:

1. An electrical controller, comprising:
   a housing, wherein the housing has cooling air openings on two different housing sides;
   a heat sink that is arranged inside the housing, so as to be protected against contact, and that forms a cooling air channel, wherein the cooling air channel runs between the cooling air openings of the different housing sides;
   an electrically insulating holding element that mechanically fixes the heat sink inside the housing in a manner electrically insulated from the housing; and
   a number of components to be cooled, wherein the components to be cooled are thermally conductively coupled to the heat sink and are held by the heat sink,
   wherein
      the number of components to be cooled comprises power semiconductors, coils and/or capacitors,
      a first number of coils are thermally conductively coupled to the heat sink on a first side of the heat sink,
      a second number of coils are thermally conductively coupled to the heat sink on a second side of the heat sink,
      the first side of the heat sink lies opposite the second side of the heat sink,
      a number of power semiconductors are thermally conductively coupled to the heat sink on a third side of the heat sink, and
      the third side of the heat sink is perpendicular to the first side and the second side of the heat sink.

2. The electrical controller as claimed in claim 1, wherein the two different housing sides lie opposite one another.

3. The electrical controller as claimed in claim 1, wherein the number of components to be cooled are thermally conductively coupled to the heat sink on at least two different sides of the heat sink.

4. The electrical controller as claimed in claim 3, wherein the number of components to be cooled are thermally conductively coupled to the heat sink on three different sides of the heat sink.

5. The electrical controller as claimed in claim 1, further comprising:
   a blower that brings about a flow of air in the cooling air channel.

6. The electrical controller as claimed in claim 1, wherein the electrical controller is a frequency converter, a servo converter or a feedback unit.

7. The electrical controller as claimed in claim 1, wherein the electrical controller has a power rating that is greater than 25 kW.

8. The electrical controller as claimed in claim 1, wherein the electrical controller has a power rating that is greater than 48 kW.

9. The electrical controller as claimed in claim 1, further comprising:
   an EMC filter electrically and thermally decoupled from the heat sink.

10. The electrical controller as claimed in claim 1, further comprising:
    a first circuit board that is arranged parallel and offset to the third side of the heat sink and that is electrically connected to the power semiconductors.

11. The electrical controller as claimed in claim 10, further comprising:

a second circuit board that is arranged parallel and offset to the second side of the heat sink and that is electrically connected to the second number of coils.

12. The electrical controller as claimed in claim 11, further comprising:
a third circuit board that is arranged parallel and offset to the second side of the heat sink and that bears a number of electrical contacts, wherein the electrical contacts are designed to connect an electrical supply line to the electrical controller.

13. The electrical controller as claimed in claim 12, wherein the second circuit board is mechanically attached to the third circuit board.

\* \* \* \* \*